United States Patent
Yang et al.

(10) Patent No.: US 6,194,325 B1
(45) Date of Patent: Feb. 27, 2001

(54) OXIDE ETCH PROCESS WITH HIGH SELECTIVITY TO NITRIDE SUITABLE FOR USE ON SURFACES OF UNEVEN TOPOGRAPHY

(75) Inventors: Chan Lon Yang, Los Gatos; Jeffrey Marks, San Jose; Nicolas Bright, Saratoga; Kenneth S. Collins, San Jose; David Groechel, Los Altos Hills; Peter Keswick, Newark, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 08/552,030

(22) Filed: Dec. 4, 1995

Related U.S. Application Data

(63) Continuation of application No. 08/145,894, filed on Oct. 29, 1993, now abandoned, which is a continuation-in-part of application No. 07/941,501, filed on Sep. 8, 1992, now Pat. No. 5,423,945.

(51) Int. Cl.$^7$ .................................................. H01L 21/302
(52) U.S. Cl. .................... 438/740; 438/714; 438/743; 438/744; 438/723; 438/724; 438/696
(58) Field of Search ....................................... 438/723, 724, 438/714, 740, 743, 744, 696

(56) References Cited

U.S. PATENT DOCUMENTS

| | | | |
|---|---|---|---|
| 4,350,578 | * 9/1982 | Frieser et al. ...................... | 204/192.1 |
| 4,368,092 | 1/1983 | Steinberg et al. ................... | 156/345 |
| 4,377,438 | * 3/1983 | Moriya et al. ....................... | 156/643 |
| 4,401,054 | 8/1983 | Matsuo et al. ....................... | 118/723 |
| 4,492,620 | 1/1985 | Matsuo et al. ...................... | 204/192 R |
| 4,511,430 | * 4/1985 | Chen et al. ......................... | 156/643 |
| 4,675,073 | * 6/1987 | Douglas .............................. | 156/643 |
| 4,778,561 | 10/1988 | Ghanbari ............................. | 156/643 |

(List continued on next page.)

FOREIGN PATENT DOCUMENTS

| | | | |
|---|---|---|---|
| 0 552 490 | 12/1992 | (EP) . | |
| 0644584 | 9/1994 | (EP) . | |
| 0651434 | 10/1994 | (EP) . | |
| 57-210631 | * 12/1982 | (JP) . | |
| 64-15928 | 1/1989 | (JP) . | |
| 2-062038 | * 3/1990 | (JP) . | |
| 2-62038 | 3/1990 | (JP) | .............................. H01L/21/302 |

OTHER PUBLICATIONS

"Selective Reactive Ion Etch for Silicon Oxide—over Silicon Nitride, Using Carbon Tetra: Fluoride and Methylene Tri:Fluoride as Etel Gases"; RD–301059–A; May 10, 1989; Anonymous; Abstract only.*

(List continued on next page.)

*Primary Examiner*—Shrive Beck
*Assistant Examiner*—George Goudreau
(74) *Attorney, Agent, or Firm*—Birgit Morris

(57) ABSTRACT

A plasma etch process is described for the etching of oxide with a high selectivity to nitride, including nitride formed on uneven surfaces of a substrate, e.g., on sidewalls of steps on an integrated circuit structure. The addition of one or more hydrogen-containing gases, preferably one or more hydrofluorocarbon gases, to one or more fluorine-substituted hydrocarbon etch gases and a scavenger for fluorine, in a plasma etch process for etching oxide in preference to nitride, results in a high selectivity to nitride which is preserved regardless of the topography of the nitride portions of the substrate surface. In a preferred embodiment, one or more oxygen-bearing gases are also added to reduce the overall rate of polymer deposition on the chamber surfaces and on the surfaces to be etched, which can otherwise reduce the etch rate and cause excessive polymer deposition on the chamber surfaces. The fluorine scavenger is preferably an electrically grounded silicon electrode associated with the plasma.

32 Claims, 1 Drawing Sheet

U.S. PATENT DOCUMENTS

| | | | |
|---|---|---|---|
| 4,807,016 | * 2/1989 | Douglas | 156/643 |
| 4,810,935 | 3/1989 | Boswell | 315/111.41 |
| 4,918,031 | 4/1990 | Flamm et al. | 437/225 |
| 4,948,458 | 8/1990 | Ogle | 156/643 |
| 5,286,344 | * 2/1994 | Blalock et al. | 156/657 |
| 5,423,945 | 6/1995 | Marks et al. | 156/662.1 |

OTHER PUBLICATIONS

Anonymous, "Selective Reactive Ion Etch for Silicon Oxide over Silicon Nitride", *Research Disclosure*, No. 301, May 1989, p. 340.

Becker, David S., et al., "A Method of Obtaining High Oxide to Nitride Selectivity in an MERIE Reactor", *Extended Abstracts*, vol. 93, No. 1, May 21, 1993, pp. 367–368.

Bondur, J.A., et al., "Gas Mixing to Prevent Polymer Formation During Reactive Ion Etching", *IBM Technical Disclosure Bulletin*, vol. 21, No. 10, Mar. 1979, p. 4016.

Plasma Etching, Chemistry of the Semiconductor Industry, 1987, pp. 374–378.

D'Agostino, Riccardo, "Summary Abstract: Mechanisms of Polymerization in Discharges of Fluorocarbons", *J. Vac. Sci. Technol. A*, vol. 3, No. 6, Nov.–Dec. 1985, pp. 2627–2628.

Moss, S.J., et al., eds, *The Chemistry of the Semiconductor Industry*, New York: Blackie & Son Ltd., 1987, pp. 374–378.

Riley, Paul E., et al., "Comparison of Etch Rates of Silicon Nitride, Silicon Dioxide, and Polycrystalline Silicon upon $O_2$ Dilution of $CF_4$ Plasmas", *J. Vac. Sci. Technol. B*, vol. 7, No. 6, Nov.–Dec. 1989, pp. 1352–1356.

Machida, Katsuyuki, et al., "$SiO_2$ Planarization Technology with Biasing and Electron Cyclotron Resonance Plasma Deposition for Submicron Interconnections", *J.Vac. Sci.Technol.B*, vol. 4, No. 4, Jul./Aug., 1986, pp. 818–821.

* cited by examiner

# OXIDE ETCH PROCESS WITH HIGH SELECTIVITY TO NITRIDE SUITABLE FOR USE ON SURFACES OF UNEVEN TOPOGRAPHY

CROSS REFERENCE TO RELATED APPLICATION

This application is a continuation of U.S. Pat. application Ser. No. 08/145,894, filed Oct. 29, 1993 now abandoned, which is a continuation-in-part of U.S. Pat. appl. Ser. No. 07/941,501, filed Sep. 8, 1992, now U.S. Pat. No. 5,423,945, allowed Jun. 13, 1995, and assigned to the assignee of this invention.

BACKGROUND OF THE INVENTION

1. Field of the Invention

This invention relates to an oxide etch process which is highly selective to nitride. More particularly, this invention relates to an oxide etch process with high selectivity to nitride which can be used on surfaces of uneven topology.

2. Description of the Related Art

A significant challenge in semiconductor fabrication is to etch an oxide such as a silicon oxide, in the presence of a nitride, such as a silicon nitride, without also etching the nitride, i.e., while maintaining a high selectivity to the nitride. An example of such could be where an oxide layer to be etched is located over a nitride layer. Since both oxide and nitride materials generally etch at the same rate in a typical fluorocarbon chemistry etch plasma commonly used for etching oxide, a process of providing additional selectivity must be found.

When a fluorine-substituted hydrocarbon, such as $C_3F_8$, is used as an etchant, the fluorocarbon radicals react in the plasma to form a passivating coating of a carbon-fluorine polymer which forms over the materials being etched, e.g., by exposed oxide and nitride surfaces on a substrate. However, this polymer is dissociated by oxide atoms formed during the etch of the exposed oxide portions. Thus, as the oxide, e.g., silicon oxide, continues to etch, the nitride portions etches at a much slower rate due to the presence of the passivating coating thereon. However, the passivating layer is also attacked by free fluorine atoms present in the plasma, and thus the nitride also continues to be etched. Thus, a selectivity over about 8:1 of silicon nitride to silicon oxide was not achievable with such prior art etch processes due to the presence of such free fluorine atoms in the plasma. Since for state of the art devices having submicron dimensions, i.e., VLSI and ULSI devices, selectivity of over 10:1 and even 30:1 are required, an etch process for etching oxide in preference to nitride with a selectivity of over 10:1 would be highly desirable.

In U.S. Pat. No. 5,423,945, the subject matter of which is hereby incorporated by reference, we described and claimed the provision of a scavenger for fluorine such as a source of silicon or carbon. This scavenger for fluorine, when used in combination with such fluorine-substituted hydrocarbon etch gases, results in the formation of a carbon-rich polymer which does not dissociate over nitride surfaces, apparently due to either the reduced free fluorine content in the plasma, or the reduced fluorine content in the polymer, or both. In any event, this use of a scavenger for fluorine in combination with fluorine-substituted hydrocarbon etch gases results in an oxide etch having a selectivity to nitride, i.e., a preference for oxide etching over nitride etching, of over 10:1, and up to as high as approaching infinity.

However, more recently an additional problem has been discovered where at least the nitride surfaces of the nitride/oxide structure being etched are not flat, as for example, the sidewalls of a slot or on raised steps such as, for example, nitride-coated polysilicon lines. This type of structure is illustrated in FIG. 1 wherein raised polysilicon lines 10 and 12, formed over a substrate 2, are coated with a conformal layer 20 of nitride, over which is formed an oxide layer 30 and a photoresist mask 40.

When oxide layer 30 is etched, through mask opening 42 in photoresist mask 40, down to conformal nitride layer 20, nitride portions 22 on the sidewalls of raised polysilicon lines 10 and 12 are also at least partially etched, indicating that the above-described protective polymer is either not forming on such generally vertical surfaces (surfaces generally perpendicular to, or at least not planar with, the underlying substrate), or the protective polymer is being more readily attacked by the etchant gases on such nonplanar surfaces than the corresponding polymer portions formed on horizontal surfaces, i.e., surfaces generally planar to the underlying substrate, such as nitride portion 26 between raised lines 10 and 12.

It would, therefore, be desirable to provide an oxide etch process highly selective to nitride which is suitable for use on surfaces of uneven topography wherein nitride surfaces which are not planar to the underlying substrate, including sidewalls on slots or raised portions, will be resistant to etching by the oxide etch process.

SUMMARY OF THE INVENTION

We have found that the addition of one or more hydrogen-containing gases, preferably one or more hydrofluorocarbon gases, to one or more fluorine-substituted hydrocarbon etch gases and a scavenger for fluorine, in a plasma etch process for etching oxide in preference to nitride, results in a high selectivity to nitride which is preserved regardless of the topography of the nitride portions of the substrate surface. In a preferred embodiment, one or more oxygen-bearing gases are also added to reduce the overall rate of polymer deposition on the chamber surfaces and on the surfaces to be etched, which polymer deposition can otherwise, respectively, reduce the etch rate, and cause excessive polymer deposition on the chamber surfaces.

DETAILED DESCRIPTION OF THE INVENTION

Figure 1:
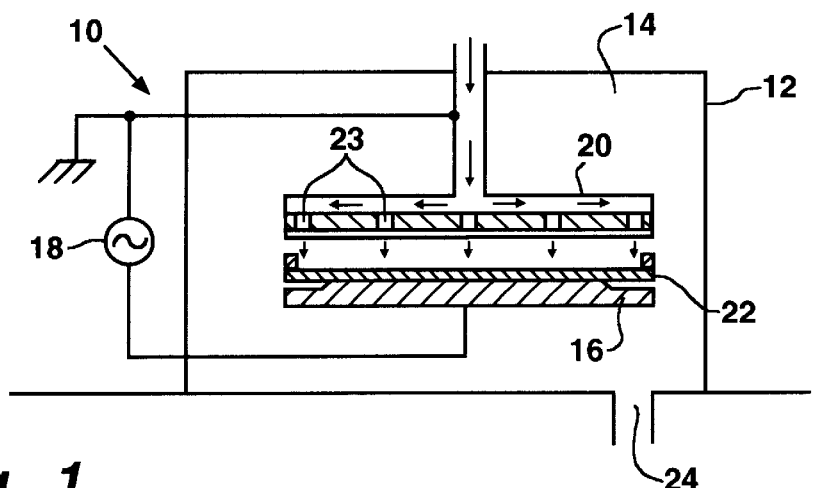
FIG. 1 is a fragmentary vertical cross-sectional view of a typical structure to be etched by the process of the invention, having uneven topography with oxide portions to be etched and nitride portions which are generally perpendicular to the underlying substrate.

The invention comprises an improved oxide plasma etching process having a high selectivity to nitride which is suitable for use with uneven topographies and comprises the addition of one or more hydrogen-bearing gases and the optional addition of one or more oxygen-bearing gases to an etchant gas comprising one or more fluorine-substituted hydrocarbon gases in contact with a scavenger for fluorine. The gases form a polymer on the surfaces to be etched, and the portion of this polymer which forms over nitride surfaces is apparently not decomposed as readily as the polymer formed in the etch process described in our parent application U.S. Pat. No. 5,423,945.

a. Hydrogen-Bearing Gases

The one or more hydrogen-bearing gases, which are added to the one or more fluorine-substituted hydrocarbon etchant gases, may comprise hydrogen and/or one or more hydrogen-containing fluorocarbons. While the use of hydrogen ($H_2$) is within the scope of the invention, it is preferred that a less flammable source of hydrogen be used. In a preferred embodiment the one or more hydrogen-bearing gases consist essentially of one or more hydrofluorocarbon gases having the formula $CH_xF_{4-x}$, where x is 1–3. Most preferably the hydrogen-bearing gas consists essentially of monofluoromethane ($CH_3F$).

The amount of hydrogen-bearing gas or gases added to the one or more fluorine-substituted hydrocarbon etchant gases may ranges from as little as 1 volume percent (vol. %) to as high as 100 vol. % of the one or more fluorine-substituted hydrocarbon etchant gases. Preferably, the amount of hydrogen-bearing gas added to the fluorine-substituted hydrocarbon etchant gases will range from about 5 vol. % to about 30 vol. % of the fluorine-substituted hydrocarbon etchant gases.

b. Oxygen-Bearing Gases.

The one or more oxygen-bearing gases, which are optionally further added to the gaseous mixture to control the polymer formation during the etching process, may comprise solely oxygen (in the form of $O_2$, $O_3$, and mixtures of same) or an oxygen-bearing gas such as CO, $CO_2$, or an oxide of nitrogen ($N_xO_y$, where x is 1 to 2 and y is 1 to 2), or mixtures of same with one another and/or with oxygen and/or ozone. Of such gases CO, $CO_2$, and mixtures of same are preferred. The amount of such oxygen-bearing gas or gases may range from as little as 1 vol. % to as much as 300 vol. % of the one or more fluorine-substituted hydrocarbon etchant gases. Preferably, the oxygen-bearing gas will range from about 50 vol. % to about 200 vol. % of the fluorine-substituted hydrocarbon etchant gases.

c. Fluorine-Substituted Hydrocarbon Etchant Gases

The one or more fluorine-substituted hydrocarbon etchant gases used in the oxide plasma etch process of the invention include $CF_4$, $C_2F_6$, $C_3F_8$ gases, as well as mixtures of same, which do not contain hydrogen and generate only carbon ions and fluorine ions. The amount of such fluorine-substituted hydrocarbon etchant gas or gases which are flowed into an etch chamber of, for example, about 8–10 liters in volume, may range from about 1 standard cubic centimeters per minute (sccm) to about 100 sccm, and preferable from about 10 sccm to about 40 sccm. It will, however, be understood by those skilled in the art that such flow rates are relative to the etch chamber volume and should be adjusted upwardly or downwardly, as the case may be, for larger or smaller etch chambers.

d. Etch Process Temperature and Pressure Parameters

The temperature of the substrate being etched will be maintained within a range of from about 10° C. to about 110° C., and preferably will be maintained at from about 80° C. to about 100° C. Temperatures below about 10° C. are considered too low for practical operation of the etch process (since the substrate tends to heat up during the etch process), while temperatures in excess of 110° C. may damage other components present on the substrate, such as, for example, the photoresist mask.

The pressure in the etch chamber during the plasma etch process will range from about 0.1 milliTorr to about 100 milliTorr, and preferably from about 1 milliTorr to about 40 milliTorr.

e. Fluorine Scavenger

With respect to the need for the addition of a fluorine scavenger to the process of the invention, although the exact mechanism for the present process is not completely understood, and there is no intent to be bound by any particular theories of operation, generally when a fluorocarbon etch gas, such as $CF_4$, $C_2F_6$, $C_3F_8$, and the like, that contains both carbon and fluorine, is exposed to a plasma, various fragments are generated in the plasma, including free fluorine atoms, CF, $CF_2$, and $CF_3$ radicals and the like. The fluorine is available to etch silicon oxides on a substrate. However, during the course of the etch process, a polymer of carbon and fluorine is also formed, that deposits onto the substrate, i.e., over both oxide and nitride surfaces thereon, forming a passivating layer. The polymer may contain about 30% by weight of carbon and about 60% by weight of fluorine. Such polymers are attacked by oxygen atoms, and thus the oxygen atoms from the oxide layer will dissociate the polymer as it is formed, without interfering with the etch of the oxide. However, when no oxygen is present, such as when a non-oxygen-containing layer is reached, i.e., a nitride layer, the silicon oxide will continue to etch, but the passivated nitride layer will etch at a slower rate.

However, the passivating polymer may also be dissociated by fluorine, and the continual formation of fluorine ions and radicals in the plasma will bombard and otherwise attack the polymer layer as well, causing the polymer to dissociate, whereupon the nitride layer will be etched as well by the plasma. Thus, the maximum selectivity of an oxide over nitride achieved prior to the process described in U.S. Pat. No. 5,423,945 was about 8:1.

However, we found that reducing the fluorine content of the passivating polymer, and reducing the amount of free fluorine in the plasma, reduces the dissociation of the passivating polymer. Thus, if a scavenger for fluorine, such as a source of silicon atoms or carbon atoms, is contacted with the plasma, silicon atoms or carbon atoms can combine with fluorine atoms, for example, to form $SiF_x$, thus reducing the number of free fluorine ions in the plasma. The polymer deposited onto the nitride layer thus may have less fluorine atoms or more carbon atoms and a "carbon-rich" polymer may result. A carbon-rich polymer is defined for the present purposes as a polymer that contains less than about 40% by weight of fluorine and over about 50% by weight of carbon and which is inert to fluorine-containing plasma etchants. Thus, when a carbon-rich polymer is deposited onto a nitride layer, almost no decomposition or reaction of the carbon-rich polymer occurs, in turn providing an almost infinite selectivity for an oxide layer over a nitride.

A source of silicon can be provided in several ways; for example, a silicon-containing gas, such as, for example: silane ($SiH_4$); a substituted silane, such as diethyl silane ($SiH_2(C_2H_4)_2$, $SiF_4$, and the like; and tetraethylorthosilicate (hereinafter TEOS) can be added to the plasma. The silicon-containing gas decomposes to form free silicon which will scavenge free fluorine atoms resulting in the formation of a carbon-rich carbon-fluorine polymer coating on the nitride layer which apparently is not attacked during the etch process resulting in a very high selectivity of the etch process to nitride.

Another method of forming such a carbon-rich carbon-fluorine polymer is by providing a source of solid elemental carbon or silicon, e.g., a silicon mesh or a non porous surface, in the plasma area where the carbon or silicon acts as another electrode. Providing a separate heated silicon source, as well as heated quartz sidewalls, in an etch reactor to promote formation of the desired carbon-fluorine polymer, is discussed in Rice et al. U. S. Pat. No. 5,477,975, entitled "PLASMA ETCH APPARATUS WITH HEATED SCAVENGING SURFACES", mailed to the USPTO on Oct. 15, 1993, and assigned to the assignee of this invention, and the disclosure of which is hereby incorporated by reference into this application.

f. Etch Plasma Parameters

The plasma generated during the oxide plasma etch process of the invention generally may comprise any plasma capable of being conventionally produced in a plasma chamber, or an adjacent chamber, for example, by providing a grounded electrode and a second electrode connected to a source of RF power.

In a preferred embodiment, however, the plasma utilized with the oxide plasma etch process of the invention is a high density plasma which may be defined as an plasma generated by an electromagnetically coupled plasma generator, in contrast to a conventional capacitively coupled plasma generator.

The term "electromagnetically coupled plasma generator" is intended to define any type of plasma generator which uses an electromagnetic field, rather than a capacitively coupled generator, to generate a plasma. Such electromagnetically coupled plasma generators can generate a plasma having an ion density of greater than about $10^{10}$ ions per cubic centimeter which is characterized herein as a "high density" plasma, which is the preferred plasma density for use in the process of the invention.

Included within the term "electromagnetically coupled plasma generator", for example, is an electron cyclotron resonance (ECR) type plasma generator such as described in Matsuo et al. U.S. Pat. No. 4,401,054; Matsuo et al. U.S. Pat. No. 4,492,620; and Ghanbari U.S. Pat. No. 4,778,561 (cross-reference to which three patents is hereby made); as well as in an article by Machida et al. entitled "SiO$_2$ Planarization Technology With Biasing and Electron Cyclotron Resonance Plasma Deposition for Submicron Interconnections", published in the Journal of Vacuum Science Technology B, Vol. 4, No. 4, Jul/Aug 1986, at pp. 818–821.

Also included in the term "electromagnetically coupled plasma generator" for example, is an inductively coupled helical or cylindrical resonator such as described in Steinberg et al. U.S. Pat. No. 4,368,092 or Flamm et al. U.S. Pat. No. 4,918,031, cross-reference to both of which patents is hereby made.

Further included in the term "electromagnetically coupled plasma generator" for example, is a helicon diffusion resonator such as the plasma generator described in Boswell U.S. Pat. No. 4,810,935, cross-reference to which is also made.

Ogle U.S. Pat. No. 4,948,458, cross-reference to which is also hereby made, describes yet a further type of electromagnetically coupled plasma generator comprising a transformer coupled plasma generator.

The RF source power level of such a high density plasma may vary from about 500 watts to about 5 kilowatts (kw), depending upon the particular type of plasma generator, size of chamber, desired etch rate, etc. For example, using an ECR type electromagnetically coupled plasma generator in association with a etch chamber of about 6 liters and a desired etch rate of about 5000 Angstroms per minute, the power would typically range from about 2 to about 3 kw. For an inductive type electromagnetically coupled plasma generator used in association with a 2 liter etch chamber and a desired etch rate of about 5000 Angstroms per minute, the power would typically range from about 1 to about 2 kw. When a high density plasma is to be generated the power density, i.e., the power level relative to the volume of the plasma generating chamber, should be equivalent to a power level of about 1000 watts in a 4 liter plasma generating chamber. RF bias power is typically applied to the electrode on which the substrate being etched resides, using the chamber wall as the ground and/or using another electrode as ground. Bias power is adjusted to yield negative DC bias of several hundred volts on the substrate being etched. Typical bias power is 600–1400 watts for a 200 millimeter diameter substrate to yield 100–300 volts DC bias.

g. Preferred Etch Apparatus

Figure 2:
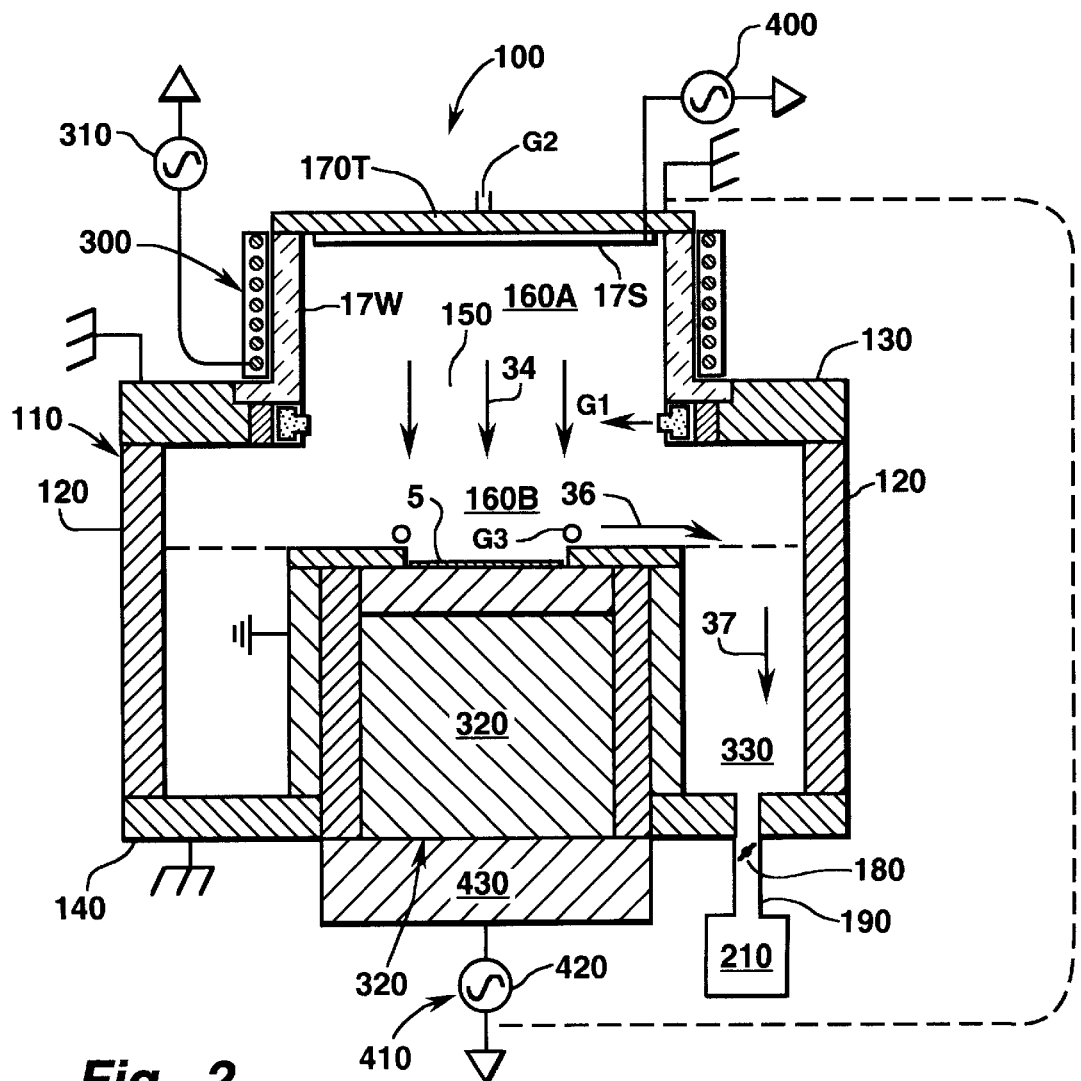
FIG. 2 is a cross sectional view of a preferred etch apparatus suitable for use with the process of the invention.

FIG. 2 illustrates an etch apparatus suitable for use in the practice of the present oxide plasma etch process of the invention, wherein a reactor system 100 includes a vacuum chamber housing 110, formed of anodized aluminum or other suitable material, having sidewalls 120 and top and bottom walls 130 and 140 respectively. A top wall 130 has a central opening 150 between a lower chamber substrate processing section 160B defined between sidewalls 120—120 and an upper chamber plasma source section 160A defined by a dome comprising dome sidewalls 17W and a dome topwall 170T. The dome topwall 170T may be configured as an inverted single or double walled cup which is formed of a dielectric, such as quartz.

The evacuation of the interior of the chamber housing 110 (chamber 160) is controlled by a throttle valve 180 in a vacuum line 190 which is inserted in the bottom wall 140 and connects to a vacuum pumping system 210 comprising one or more vacuum pumps.

Process gases can be supplied to the chamber 110 by three manifold injection sources, G1, G2, and G3 located respectively at the base of the source region 160A, at the dome top 170T, and peripherally about the substrate 5 to be etched. The overall gas flow is along path 34 from the chamber source region 160A toward the substrate 5, and along path 36 from the substrate 5 to the outlet manifold 330, and along path 37 from the outlet manifold 330 to the vacuum system 210.

RF energy is supplied to the dome adjacent dome sidewall 17W by a source comprising an antenna 300 of at least one turn or coil which is powered by an RF supply and matching network 310. The antenna 300 is tuned to resonance, or resonated using lumped elements, i.e., for example, capacitors, for efficient inductive coupling with the plasma source. A plasma is generated in the dome concentrated in the volume defined within the coil antenna 300. Active species, including ions, electrons, free radicals, and excited neutrals, move toward the substrate 5 to be etched by diffusion and by bulk flow due to the gas flow generated by the gas manifold system G1, G2, and G3. A bias energy input arrangement 410, comprising a source 420 and a bias matching network 430, couples RF energy to the substrate support electrode 320 for selectively increasing the plasma sheath voltage at the substrate, and thus selectively increasing the ion energy at the substrate.

In the illustrated embodiment, the chamber 110 further incorporates a unique, three-electrode arrangement which provides the fluorine scavenger associated with the plasma as described herein. The substrate support electrode 320 comprises a cathode, the chamber side walls 120 comprises the anode, and a third electrode comprises a sacrificial electrode 17S located beneath the dome top plate 170T. This third electrode may be floating, but is preferably either grounded or connected to an RF power supply 400 and is preferably made of silicon or a silicon-containing alloy, or carbon such as graphite. Excess fluorine ions then interact with this third electrode to form $SiF_x$ or $CF_x$, as the case may be, thereby reducing the total number of fluorine ions in the plasma.

The following examples will serve to illustrate the various embodiments of the invention.

EXAMPLE I

A 150 millimeter diameter substrate comprising a silicon wafer having a photoresist mask and a layer of silicon oxide beneath the mask of about 5000–10,000 Angstroms thick over a silicon nitride layer deposited by PECVD, and which, in turn was formed over steps on the silicon wafer, forming a structure similar to the one shown in FIG. 1, was etched in an RF etch chamber as described above with respect to FIG. 2, and commercially available from Applied Materials, Inc. as a Centura™ HDP Dielectric Etch System. A grounded third electrode made of silicon, and maintained in the etch chamber at a temperature of about 260° C., was used as the source of silicon comprising the fluorine scavenger. 20 sccm of $C_3F_8$ was flowed into the chamber as the fluorine-substituted hydrocarbon etching gas, together with 3 sccm of $CH_3F$ as the hydrogen-bearing gas. The pressure in the etch chamber was maintained at about 3 milliTorr during the etch and the temperature of the substrate was maintained at about 100° C. The plasma generator power level was maintained at about 2000 watts. A bias voltage of minus 200 volts D.C. was maintained on the substrate during the etch by adjusting the RF bias power to 650 watts. The etch was carried out through the opening in the mask for about 2 minutes, thereby exposing the nitride layer beneath the etched opening in the oxide layer through the resist mask.

The respective oxide and nitride layers, including the portions of the nitride layer on the sidewalls of the steps, were examined by SEM and the ratio of etched oxide to etched nitride, i.e., the selectivity of the etch process of the invention to nitride on the flat regions was found to be about ∞:1, while the nitride to oxide selectivity on the sidewalls of the steps was found to be about 15:1.

EXAMPLE II

To illustrate the process of Example I with the addition of an oxygen-bearing gas to the etch process of the invention, the procedure of Example I was repeated on a similarly coated substrate, except that 30 sccm of CO gas was also flowed into the chamber with the $C_2F_6$ fluorine-substituted hydrocarbon etch gas and the $CH_3F$ hydrogen-bearing gas. The etch was again carried out for about 2 minutes. The respective layers were again examined by SEM, as in Example I, and the ratio of etched oxide to etched nitride, i.e., the selectivity of the etch process of the invention to nitride was again found to be about ∞:1 in the flat regions and over 12:1 on the nitride sidewalls. Substrates processed in accordance with Example II were further examined by SEM for any evidence of etch residues or polymer deposits on the substrates and no such materials were found, even after the processing of over 200 substrates in the etch chamber.

Thus, the process of the invention provides for the plasma etching of an oxide layer, in the presence of nitride, with a high selectivity to nitride which is independent of the position of the nitride layer with respect to the plane of the underlying substrate, by the addition of a hydrogen-bearing gas to a fluorine-substituted hydrocarbon etching gas used in connection with a fluorine scavenger. Furthermore, the etch rate may be increased, and the chamber wall deposits decreased, by the addition of an oxygen-bearing gas to the gas mixture during the etch process.

Having thus described the invention what is claimed is:

1. A process for plasma etching an oxide layer over a nitride layer capable of exhibiting selectivity to the nitride layer, including nitride on uneven surfaces, which comprises
   contacting said oxide layer with a mixture of gases comprising:
      a) one or more fluorine-substituted hydrocarbon etching gases; and
      b) one or more hydrogen-bearing gases;
   in the presence of a fluorine scavenger selected from the group consisting of solid silicon and carbon.

2. The process of claim 1 wherein the total amount of said one or more hydrogen-bearing gases ranges from about 1 vol. % to about 100 vol. % of said one or more fluorine-substituted hydrocarbon etching gases.

3. The process of claim 2 wherein said one or more fluorine-substituted hydrocarbon gases each have a formula $C_xF_{(2x+2)}$, where x is 1–3.

4. The process of claim 2 wherein said one or more hydrogen-bearing gases is selected from the group consisting of hydrogen, one or more hydrofluorocarbons having the formula $C_xH_yF_z$, and mixtures of two or more of same, where x is 1–3, y is from 1 to 2x+1, and z is 2x+2−y.

5. The process of claim 2 wherein said one or more hydrogen-bearing gases is selected from the group consisting of monofluoromethane ($CH_3F$), difluoromethane ($CH_2F_2$), trifluoromethane ($CHF_3$), and mixtures of two or more of same.

6. The process of claim 2 wherein said one or more hydrogen-bearing gases consists essentially of monofluoromethane ($CH_3F$).

7. The process of claim 2 wherein said mixture of gases further comprises one or more oxygen-bearing gases in an amount ranging from about 1 vol. % to about 300 vol. % of said one or more fluorine-substituted hydrocarbon etching gases.

8. The process of claim 7 wherein said one or more oxygen-bearing gases are selected from the group consisting of oxygen ($O_2$), ozone ($O_3$), carbon monoxide (CO), carbon dioxide ($CO_2$), an oxide of nitrogen ($N_xO_y$, where x is 1–2 and y is 1 to 2), and mixtures of two or more of same.

9. The process of claim 7 wherein said one or more oxygen-bearing gases are selected from the group consisting of carbon monoxide, carbon dioxide, and mixtures of same.

10. The process of claim 1 wherein said fluorine scavenger is a silicon surface spaced from said oxide and nitride.

11. The process of claim 10 wherein said silicon surface fluorine scavenger is electrically associated with said plasma.

12. The process of claim 10 wherein said silicon surface fluorine scavenger is grounded.

13. The process of claim 10 wherein said silicon surface fluorine scavenger is maintained at a temperature within a range of from about 200° C. to about 280° C.

14. An oxide plasma etch process capable of exhibiting selectivity to nitride, including nitride sidewalls in an integrated circuit structure on a substrate, which comprises;
   a) loading into an etch chamber a substrate containing an oxide layer and a nitride layer;
   b) flowing into said etch chamber:
      i) one or more fluorine-substituted hydrocarbon etching gases having the formula $C_xF_{(2x+2)}$, where x is 1–3;
      ii) one or more hydrogen-bearing gases consisting essentially of hydrofluorocarbons having the formula $C_xH_yF_z$, where x is 1–3, y is from 1 to 2x+1, and z is 2x+2–y; and
      iii) optionally one or more oxygen-bearing gases;
   c) igniting a plasma in said chamber; and
   d) contacting with said plasma a fluorine scavenger selected from the group consisting of silicon and carbon;
whereby said oxide layer will be etched while maintaining a selectivity to nitride.

15. The process of claim 1 wherein the total amount of said one or more hydrogen-bearing gases flowing into said chamber ranges from about 1 vol. % to about 100 vol. % of said one or more fluorine-substituted hydrocarbon etching gases.

16. The process of claim 14 wherein the total amount of said one or more hydrogen-bearing gases flowing into said chamber ranges from about 5 vol. % to about 30 vol. % of said one or more fluorine-substituted hydrocarbon etching gases.

17. The process of claim 14 wherein the total amount of said one or more oxygen-bearing gases flowing into said chamber ranges from about 0 vol. % to about 300 vol. % of said one or more fluorine-substituted hydrocarbon etching gases.

18. The process of claim 14 wherein said fluorine scavenger in contact with said plasma comprises silicon.

19. The process of claim 14 wherein said fluorine scavenger comprises solid silicon in contact with said plasma.

20. The process of claim 19 wherein said solid silicon fluorine scavenger is electrically grounded.

21. The process of claim 18 wherein said fluorine scavenger comprises a silicon-containing gas in contact with said plasma.

22. A process for plasma etching oxide in the presence of nitride capable of exhibiting selectivity to nitride, including nitride on uneven surfaces, which comprises contacting said oxide with a mixture of gases comprising:
   a) one or more fluorine-substituted hydrocarbon etching gases;
   b) one or more hydrogen-bearing gases; and
   c) optionally, one or more oxygen-bearing gases;
in the presence of a fluorine scavenger comprising an electrically grounded silicon electrode.

23. An oxide plasma etch process capable of exhibiting selectivity to nitride, including nitride sidewalls in an integrated circuit structure on a substrate, which comprises;
   a) loading into an etch chamber a substrate containing a silicon oxide layer and a silicon nitride layer;
   b) flowing into said etch chamber:
      i) a fluorine-substituted hydrocarbon etching gas having the formula $C_3F_8$;
      ii) a hydrofluorocarbon gas having the formula $CH_3F$; and
      iii) optionally one or more oxygen-bearing gases;
   c) igniting a plasma in said chamber; and
   d) contacting a fluorine scavenger with said plasma;
whereby said silicon oxide layer will be etched while maintaining a selectivity to silicon nitride.

24. A process for plasma etching oxide in the presence of nitride capable of exhibiting selectivity to nitride, including nitride on uneven surfaces, which comprises contacting said oxide with a mixture of gases comprising:
   a) one or more fluorine-substituted hydrocarbon etching gases;
   b) one or more hydrogen-bearing gases in an amount ranging from about 1 vol. % to about 100 vol. % of said one or more fluorine-substituted hydrogen etching gases; and
   c) one or more oxygen-bearing gases in an amount ranging from about 1 vol. % to about 300 vol. % of said one or more fluorine-substituted hydrocarbon etching gases; in the presence of a fluorine scavenger.

25. The process of claim 24 wherein said one or more oxygen-bearing gases are selected from the group consisting of oxygen ($O_2$), ozone ($O_3$), carbon monoxide (CO), carbon dioxide ($CO_2$), an oxide of nitrogen ($N_xO_y$, where x is 1–2 and y is 1 to 2), and mixtures of two or more of same.

26. The process of claim 24 wherein said one or more oxygen-bearing gases are selected from the group consisting of carbon monoxide, carbon dioxide, and mixtures of same.

27. A process for plasma etching oxide in the presence of nitride capable of exhibiting selectivity to nitride, including nitride on uneven surfaces, which comprises contacting said oxide with a mixture of gases comprising:
   a) one or more fluorine-substituted hydrocarbon etching gases; and
   b) one or more hydrogen-bearing gases in an amount ranging from about 1 vol. % to about 100 vol. % of said one or more fluorine-substituted hydrogen etching gases;
in the presence of a fluorine scavenger selected from the group consisting of silicon and carbon.

28. An oxide plasma etch process capable of exhibiting selectivity to nitride, including nitride sidewalls in an integrated circuit structure on a substrate, which comprises;
   a) loading into an etch chamber a substrate containing an oxide layer and a nitride layer;
   b) flowing into said etch chamber:
      i) one or more fluorine-substituted hydrocarbon etching gases having the formula $C_xF_{(2x+2)}$, where x is 1–3;
      ii) one or more hydrogen-bearing gases consisting essentially of hydrofluorocarbons having the formula $C_xH_yF_z$, where x is 1–3, y is from 1 to 2x+1, and z is 2x+2–y; and iii) optionally one or more oxygen-bearing gases;

c) igniting a plasma in said chamber; and d) contacting a fluorine scavenger comprising silicon with said plasma;

whereby said oxide layer will be etched while maintaining a selectivity to nitride.

29. A process of plasma etching oxide in the presence of nitride capable of exhibiting high selectivity to nitride comprising:

a) disposing a substrate comprising said oxide and said nitride within a processing chamber;

b) supplying to said chamber a mixture of gases comprising one or more fluorine-substituted hydrocarbon etching gases and one or more hydrogen-bearing gases; and c) coupling RF power to an electrode disposed above a top surface of said substrate within said chamber, said electrode comprising a fluorine scavenger selected from the group consisting of silicon and carbon.

30. The process of claim 29 further comprising electromagnetically coupling RF power into said chamber to generate said plasma.

31. The process of claim 29 further comprising maintaining a temperature of said electrode between 200° C. and 300° C.

32. The process of claim 29 wherein said electrode comprises silicon.

* * * * *